(12) United States Patent
Mirow

(10) Patent No.: US 7,545,181 B2
(45) Date of Patent: Jun. 9, 2009

(54) REDUCED OFFSET VOLTAGE COMPARATOR SYSTEM

(76) Inventor: Fred Mirow, 118 Cornell Rd., Bala Cynwyd, PA (US) 19004

(*) Notice: Subject to any disclaimer, the term of this patent is extended or adjusted under 35 U.S.C. 154(b) by 31 days.

(21) Appl. No.: 11/603,589

(22) Filed: Nov. 24, 2006

(65) Prior Publication Data

US 2007/0152717 A1     Jul. 5, 2007

Related U.S. Application Data

(60) Provisional application No. 60/755,115, filed on Dec. 31, 2005.

(51) Int. Cl.
*H03K 5/22* (2006.01)
(52) U.S. Cl. ............................................. 327/63; 327/72
(58) Field of Classification Search ....................... None
See application file for complete search history.

(56) References Cited

U.S. PATENT DOCUMENTS

| 3,968,486 A | * | 7/1976 | Gerdes | 341/161 |
| 5,068,662 A | * | 11/1991 | Guddanti et al. | 341/161 |
| 6,498,577 B1 | * | 12/2002 | Lin | 341/156 |
| 2007/0241953 A1 | * | 10/2007 | Morisson | 341/159 |

* cited by examiner

*Primary Examiner*—Tuan Lam
*Assistant Examiner*—Hiep Nguyen

(57) ABSTRACT

A method for comparing two signal with increased accuracy by using a reduced offset voltage comparator that has a offset zero mode and amplify mode. Additional comparators are used to indicate when the two signal are close in value. When the signal are close the reduced offset voltage comparator operation is changed from offset zero mode to amplify mode and the two signal are compared.

4 Claims, 2 Drawing Sheets

REDUCED OFFSET VOLTAGE COMPARATOR SYSTEM 100

AMPLIFIER SYSTEM 50A

TIMING DIAGRAM

REDUCED OFFSET VOLTAGE COMPARATOR SYSTEM

CROSS-REFERENCE TO RELATED APPLICATIONS

The benefits of filing this invention as Provisional application for patent "REDUCED OFFSET VOLTAGE COMPARATOR SYSTEM", U.S. PTO 60/755,115 filed Dec. 31, 2005 by Fred Mirow are claimed.

FIELD OF THE INVENTION

The present invention relates to differential comparator systems with offset voltage reduction.

BACKGROUND OF THE INVENTION

A comparator, in its basic form, compares two input signals to determine which one is of higher magnitude. It outputs a high or low response depending on whether a first input is higher than a second input. Comparators have internal sources of errors that cause the output voltage level transitions to occur at a level different than when the input voltage levels transitions pass being equal. This error is referred to as the offset voltage.

One current way of way of compensating for offset voltage is by trimming the device. In this method, a set of resistors is implanted on a chip. During the manufacturing process, but after the chip is made, the bias is determined and compensated for by fusing or severing the links between the resistors on the chip. On-chip trimming techniques can reduce offset voltage to a very low value.

The trimming technique has a drawback in that it is one time or a single shot operation and is therefore only provides compensation for the offset at the conditions under which it was tested. For a system that may undergo a wide range of operating conditions, trimming may not be optimal. This is because the actual comparator offset voltage value is subject to deviations due to variations in input common mode voltage, temperature, and supply voltage.

SUMMARY OF THE INVENTION

The present invention is a method for comparing two signals with increased accuracy by using a reduced offset voltage comparator. This comparator has a offset zero mode and amplify mode. Additional conventional comparators are used to indicate when the two signal are close in value. When the signals are close the reduced offset voltage comparator operation is changed from offset zero mode to amplify mode. The reduced offset voltage comparator is now used to make an accurate comparison of the two signal levels. When the conventional comparators indicate that the two signal are not close in value, the reduced offset voltage comparator operation is changed from amplify mode to offset zero mode. During the offset zero mode the reduced offset voltage comparator reduces the offset voltage is to almost zero.

Mechanical stress, thermal stress, and other operating condition variations will not significantly effect performance because the reduced offset voltage comparator circuit frequently returns to the offset zero mode to keep reducing the offset voltage. Further, if the offset is stored digitally as opposed to with a capacitor, the circuit can extend periods of time between returns to the offset zero mode.

The present invention solves the problem of maintaining a desired low offset voltage over a wide range of operating conditions including common mode voltage, temperature, and supply voltage even as the conditions change.

DETAILED DESCRIPTION

Figure 1:
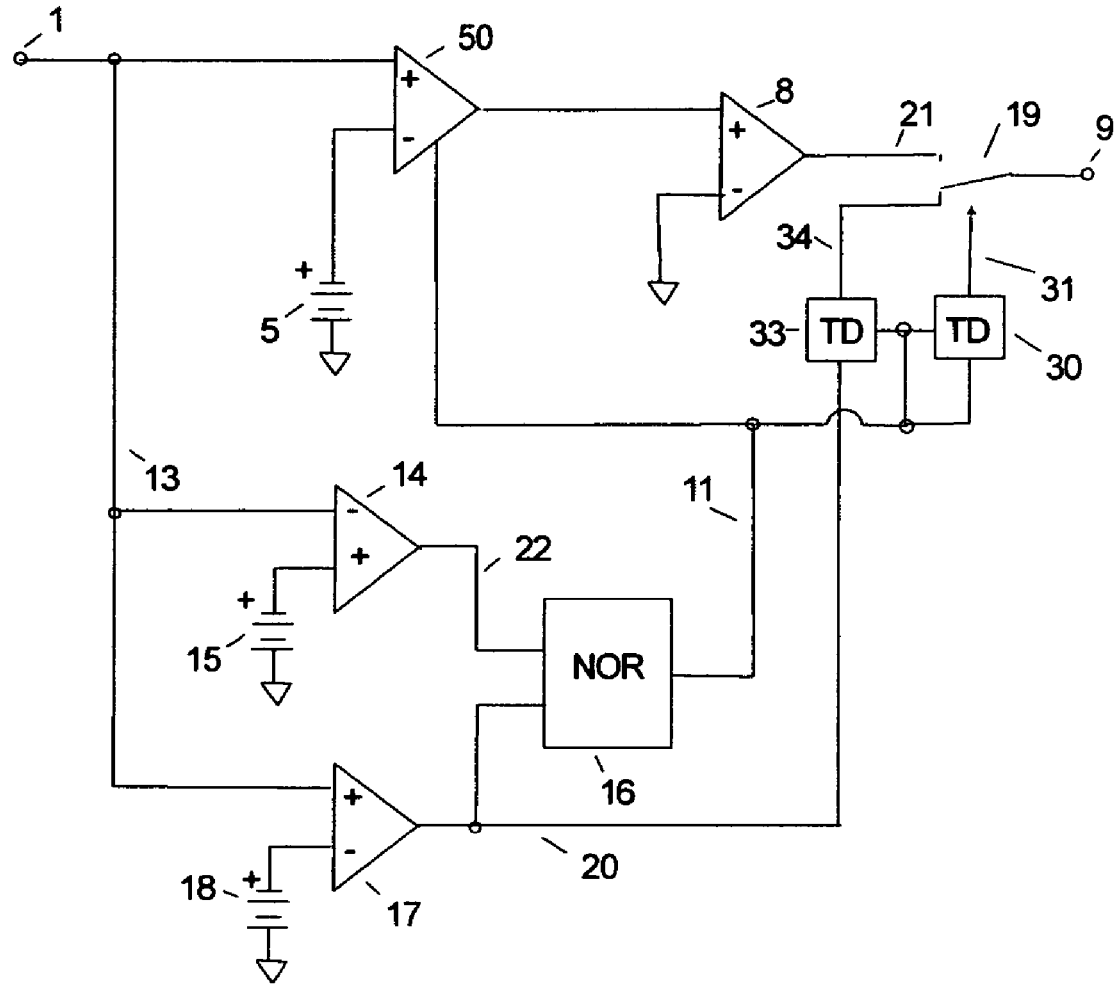
FIG. 1 is a schematic representation of a Reduced Offset Voltage Comparator System 100 in accordance with one embodiment of the present invention.

The Reduced Offset Voltage Comparator System 100 FIG. 1 consist of three comparators 17, 14, and 8. The input signal at terminal 1 is applied to line 13. Comparators 14 has it's positive input connected to reference voltage 15 and it's negative input connected to line 13. Comparators 17 has it's negative input connected to reference voltage 18 and it's positive input connected to line 13.

Amplifier system 50 has it's negative input connected to reference voltage 5 and it's positive input connected to line 13. Comparators 8 has it's negative input connected to ground and it's positive input connected to the output of Amplifier system 50. Comparators 8 output is on line 21. Comparator 17 output is on line 20 and Comparator 14 output is on line 22. Line 20 and 22 are connected to the inputs of NOR gate 16. The output of NOR gate 16 on line 11 is low when either line 20 or 22 is high. Line 20 is also connected to the input of Time delay 33. Output terminal 9 is connected by switch 19 to either the output of Comparator 8 or Time delay 33.

Reference voltage 5 is set to the same value as the input signal level that is to be detected by comparison. Reference voltage 18 is set greater than that of reference voltage 5 and Reference voltage 15 is set less than that of reference voltage 5 so that comparators 17 and 14 output signal transitions always occurs at a higher or lower input signal level than Reference voltage 5 level under all conditions including their own internal offset voltages.

Figure 3:
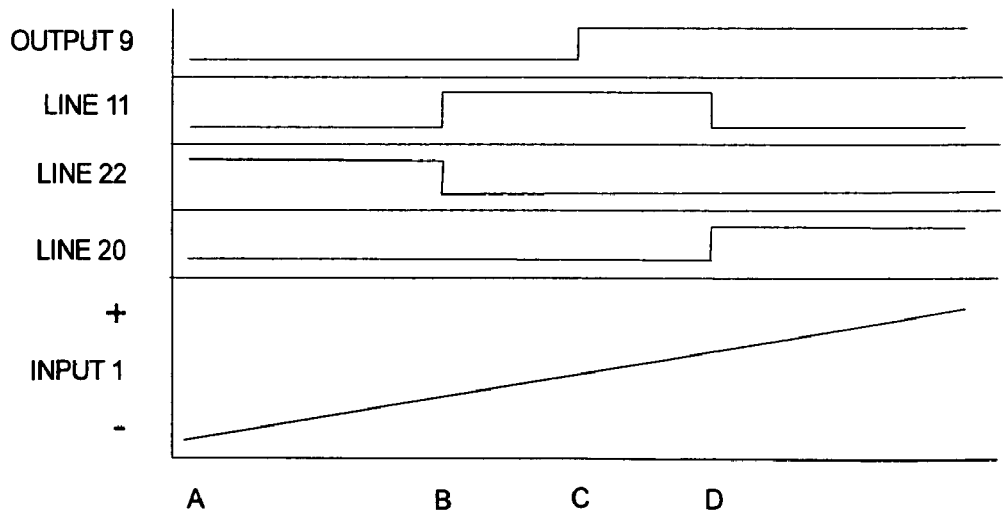
FIG. 3 is a diagram illustrating various Reduced Offset Voltage Comparator System 100 circuit waveforms.

When the voltage level at input terminal 1, as shown at time A in FIG. 3, is less than that of voltage references 15 and 18 the signal on line 22 is high, the signal on line 20 is low, and the signal on line 11 is low. Output terminal 9 is connected by switch 19 to output of Time delay 33. The output of Time delay 33 is the same level as line 20 which is low.

Amplifier system 50 has two operating modes. When line 11 is high it is in amplify mode and when line 11 is low it is in offset zero mode. Amplifier system 50 is now in offset zero mode in which the signal at input 1 is not being amplified and the offset voltage of Amplifier system 50 is being stored.

When the voltage level at input terminal 1 as shown at time B in FIG. 3 is less than that of voltage references 18 and 5 but greater than that of voltage reference 15. The signal on lines 20 and 22 are both low and the signal on line 11 is now high. Amplifier system 50 is now in amplify mode in which the signal at input 1 is being amplified and the input offset is being compensated for. Amplifier system 50 output signal is applied to the input of Comparator 8. Since the input signal at input 1 was multiplied by the gain of Amplifier system 50, the effective error at input 1 caused by the offset voltage of Comparator 8 is reduced.

Time delay 30 and 33 are controlled by the signal level of line 11. When line 11 goes high, Time delay 30 and 33 have their input signals delayed by a fixed time period. The delay time of Time delay 33 is longer than that of Time delay 30. line 11 also provides a high signal level to the input of Time delay 30. The delay time produced by Time delay 30 allows Amplifier system 50 and Comparator 8 to stabilize at their correct low output level. Time delay 33 maintains the low signal level on line 34 even though the signal at its input on line 20 has now gone high. Output terminal 9 is now connected by switch 19 to line 21.

When the voltage level at input terminal 1 as shown at time C in FIG. 3 is less than that of voltage references 18, but greater than that of voltage reference 15 and 5. The signal on lines 20 and 22 are still both low and the signal on line 11 is high. Output terminal 9 is still connected by switch 19 to line 21. Amplifier system 50 is still in amplify mode and the signal at input 1 is being amplified and then applied to the input of Comparator 8. The output of Comparator 8 is now high and applied to output terminal 9 through switch 19.

When the voltage level at input terminal 1 increases to the level as shown at time D in FIG. 3, it is now greater than that of voltage references 15 and 18 the signal on line 22 is now low, the signal on line 20 becomes high, and the signal on line 11 goes low. Also when line 11 goes low the time delay of Time delay 33 and 30 are both reduced to near zero, and line 31 goes low. Switch 19 now connects Output terminal 9 to line 34 which is high.

Amplifier system 50 is now placed in offset zero mode in which the signal a input 1 is not being amplified and the offset voltage of Amplifier system 50 is being stored.

Figure 2:
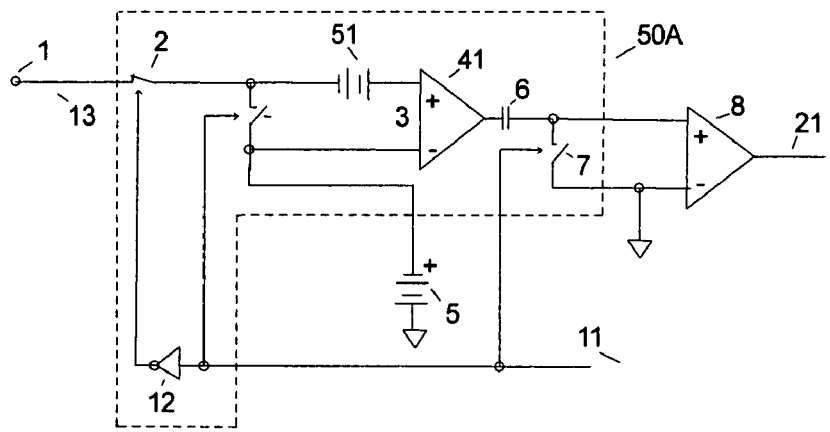
FIG. 2 is a schematic representation of Amplifier System 50A in accordance with one embodiment of the present invention.

One implementation of Amplifier system 50, Amplifier system 50A is shown in FIG. 2. Amplifier 41 is a differential amplifier with it's negative input connected to voltage references 5 and one end of switch 3. Amplifier 41 positive input is connected to offset voltage 51. The other end of offset voltage 51 is connected to one end of switch 3 and one end of switch 2. Amplifier 41 output is connected to one end of capacitor 6. The other end on capacitor 6 is connected the positive input of comparator 8 and one end of switch 7. The other end of switch 7 is connected to ground. Switches 3 and 7 are controlled by the signal level on line 11 along with the input of inverter 12. Switch 2 is controlled by the output of inverter 12 which inverts the signal level on line 11.

When the signal level on line 11 is low Amplifier system 50A is in offset zero mode. Switch 2 is open and switches 3 and 7 are closed. Amplifier 41 negative input and positive input through offset voltage 51 are both connected to voltage references 5. Capacitor 6 is now connected between ground and Amplifier 41 output. During this time a voltage level needed to cancel out from Amplifier 41 output signal the error caused by the offset voltage 51 is stored in Capacitor 6.

When the signal level on line 11 is high Amplifier system 50A is in amplify mode. Switch 2 is closed and switches 3 and 7 are open. Amplifier 4 negative input is connected to voltage references 5 and positive input is connected through Offset voltage 51 and switch 2 to input terminal 1. Amplifier 41 output is applied through Capacitor 6 to Comparator 8 input. Amplifier 41 output is the, (amplified combination of input terminal 1 signal plus offset voltage 51), minus the stored voltage on Capacitor 6. Since the voltage on Capacitor 6 and amplified offset voltage level are nearly equal, the error caused by the offset voltage 51 is nearly reduced to zero.

Other well known methods of offset voltage reduction store the offset correction voltage digitally as opposed to with a capacitor or stores the offset correction voltage in the gate capacitance of the input stage MOSFET. These circuits have the advantage that they can withstand longer periods of time between being placed in offset zero mode.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the claims.

What is claimed is:

1. A comparator system for sensing an analog input signal level and for producing a digital output signal, the comparator system comprising:

first reference means for providing a first reference level to which said analog input signal level is to be compared, second reference means for providing a second reference level different from said first reference level, first comparator means for comparing said analog input signal level to said second reference level, a control signal responsive to said first comparator means, amplifier system means responsive to said control signal that selects said amplifier system operation in either amplify mode or offset zero mode, said amplifier system means having an offset voltage, said amplifier system means when in said amplify mode amplifying with error caused by said offset voltage the difference in level between said input signal and said first reference level, second comparator means for producing a digital output signal with value dependent on said amplifier system means' output level when in said amplify mode, storage means for storing when said amplifier system means is in said offset zero mode a correction signal at a level that reduces said error, and circuit means for applying said correction signal to said amplifier system means when in said amplify mode to reduce said error whereby the said comparator system has reduced offset voltage.

2. A comparator system as defined in claim 1, wherein said control signal level indicates said analog input signal has crossed over said second reference level in a predetermined direction.

3. A comparator system for sensing an analog input signal voltage level and for producing a digital output signal, the comparator system comprising:

first reference means for providing a first reference voltage level to which said analog input signal voltage level is to be compared, second reference means for providing a second reference voltage level at a lower level than said first reference voltage, third reference means for providing a third reference voltage level at a higher level than said first reference voltage, first comparator means for comparing said analog input signal voltage level to said second reference voltage level and said third reference voltage level, a control signal responsive to said first comparator means, amplifier system means responsive to said control signal that selects said amplifier system operation in either amplify mode or offset zero mode, said first comparator means having said control signal indicate when said analog input signal voltage level is greater than said second reference voltage level and lower than said third reference voltage level causing said amplifier system means to operate in amplify mode, said amplifier system means having an offset voltage, said amplifier system means when in said amplify mode amplifying with error caused by said offset voltage the difference in voltage level between said input signal and said first reference voltage level, second comparator means for producing a digital output signal with value dependent on said amplifier system means' output level when in said amplify mode, storage means for storing when said amplifier system means is in said offset zero mode a correction signal at a level that reduces said error, and circuit means for applying said correction signal to said amplifier system means when in said amplify mode to reduce said error whereby the said comparator system has reduced offset voltage.

4. A comparator system as defined in claim 3, wherein said second comparator means has a digital output signal indicating which said mode of operation said amplifier system means is in.

* * * * *